United States Patent
Hughes et al.

(10) Patent No.: US 10,447,261 B1
(45) Date of Patent: Oct. 15, 2019

(54) DUAL GATE III-SWITCH FOR HIGH VOLTAGE CURRENT RELAY

(71) Applicant: HRL Laboratories, LLC, Malibu, CA (US)

(72) Inventors: Brian Hughes, Woodland Hills, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 286 days.

(21) Appl. No.: 15/191,494

(22) Filed: Jun. 23, 2016

(51) Int. Cl.
*H03K 17/785* (2006.01)
*H01L 31/0304* (2006.01)

(52) U.S. Cl.
CPC ..... *H03K 17/785* (2013.01); *H01L 31/03044* (2013.01)

(58) Field of Classification Search
CPC ............ H03K 17/785; H01L 31/03044; H01L 27/304
See application file for complete search history.

(56) References Cited

U.S. PATENT DOCUMENTS

| | | | |
|---|---|---|---|
| 3,341,821 A | 9/1967 | Kessler | |
| 3,967,253 A * | 6/1976 | Tsuruishi | G02F 1/055 345/100 |
| 4,545,651 A * | 10/1985 | Kato | G02B 27/1006 359/485.02 |
| 7,893,541 B2 | 2/2011 | Caporaso et al. | |
| 2003/0042404 A1 | 3/2003 | Rice et al. | |
| 2009/0072153 A1* | 3/2009 | Musrock | G01T 1/2985 250/363.03 |
| 2015/0270381 A1* | 9/2015 | Lee | H01L 29/66462 257/20 |
| 2016/0211418 A1* | 7/2016 | Totani | H01L 33/42 |
| 2017/0338256 A1* | 11/2017 | Okihara | H01L 27/1443 |

OTHER PUBLICATIONS

Sullivan, J.S.; Stanley, J.R.; , "Wide Bandgap Extrinsic Photoconductive Switches," Plasma Science, IEEE Transactions on, vol. 36, No. 5, pp. 2528-2532, Oct. 2008.

Morita, T.; Yanagihara, M.; Ishida, H.; Hikita, M.; Kaibara, K.; Matsuo, H.; Uemoto, Y.; Ueda, T.; Tanaka, T.; Ueda, D.; , "650 V 3.1 mΩcm2 GaN-based monolithic bidirectional switch using normally-off gate injection transistor," Electron Devices Meeting, 2007. IEDM 2007. IEEE International , vol., No., pp. 865-868, Dec. 10-12, 2007.

(Continued)

*Primary Examiner* — Elias Ullah

(74) *Attorney, Agent, or Firm* — Ladas & Parry

(57) ABSTRACT

Photo-switchable relays and switches and dual gate III-switches having a photo switchable normally-off region located in the channel layer of the device are disclosed where irradiation of the normally-off regions with an appropriate wavelength of radiation results in generation of charge carriers and the flow of electricity through the device being turned on and off in response to the radiation being turned on and off.

21 Claims, 9 Drawing Sheets

(56) References Cited

OTHER PUBLICATIONS

Minghe Wu; Xiaoming Zheng; Chengli Ruan; Hongchun Yang; Yunqing Sun; Shan Wang; Gang Zeng; Hong Liu; , "The high voltage nanosecond electric pulse generator based on a photoconductive semiconductor switch," Power Electronics and Intelligent Transportation System (PEITS), 2009 2nd International Conference on , vol. 2, No., pp. 136-139, Dec. 19-20, 2009.
James, C.; Hettler, C.; Dickens, J., "High voltage photoconductive switches using semi-insulating, vanadium doped 6H-SiC," Pulsed Power Conference, 2009. PPC '09. IEEE , vol., No., pp. 283-286, Jun. 28, 2009-Jul. 2, 2009.
Huang, Z.D.; Weng, W.Y.; Chang, S.J.; Hung, S.C.; Chiu, C.J.; Hsueh, T.J.; Lai, W.C.; Wu, S.L.; , "GaN Schottky Barrier Photodetectors With a Lattice-Matched $Al_{0.82}In_{0.18}N$ Intermediate Layer," Sensors Journal, IEEE , vol. 11, No. 11, pp. 2895-2901, Nov. 2011.

\* cited by examiner

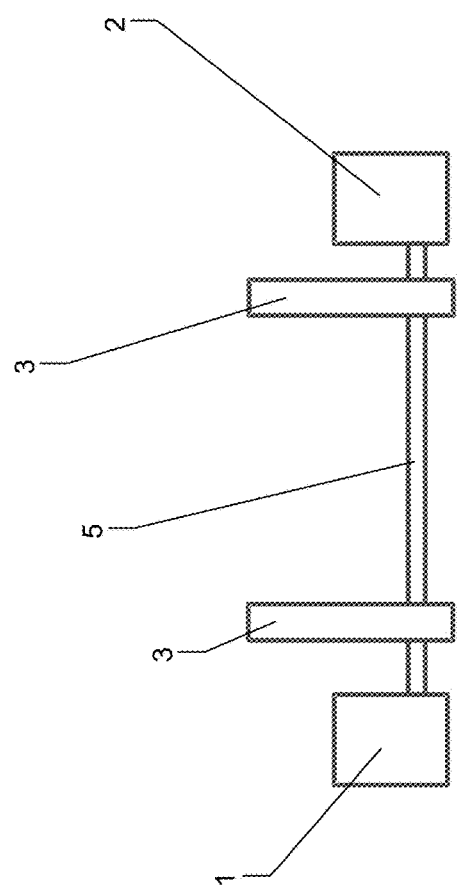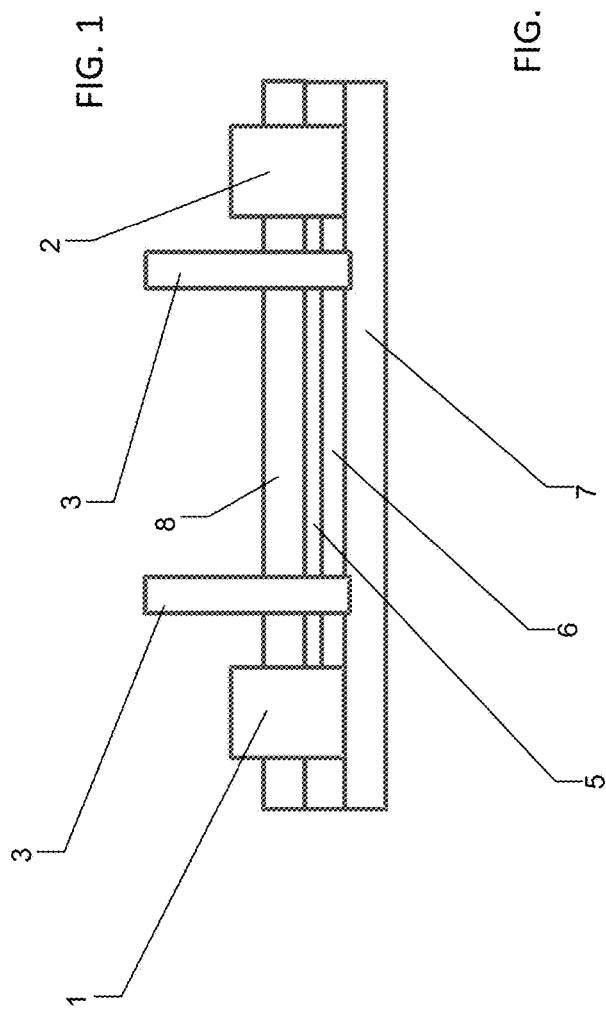

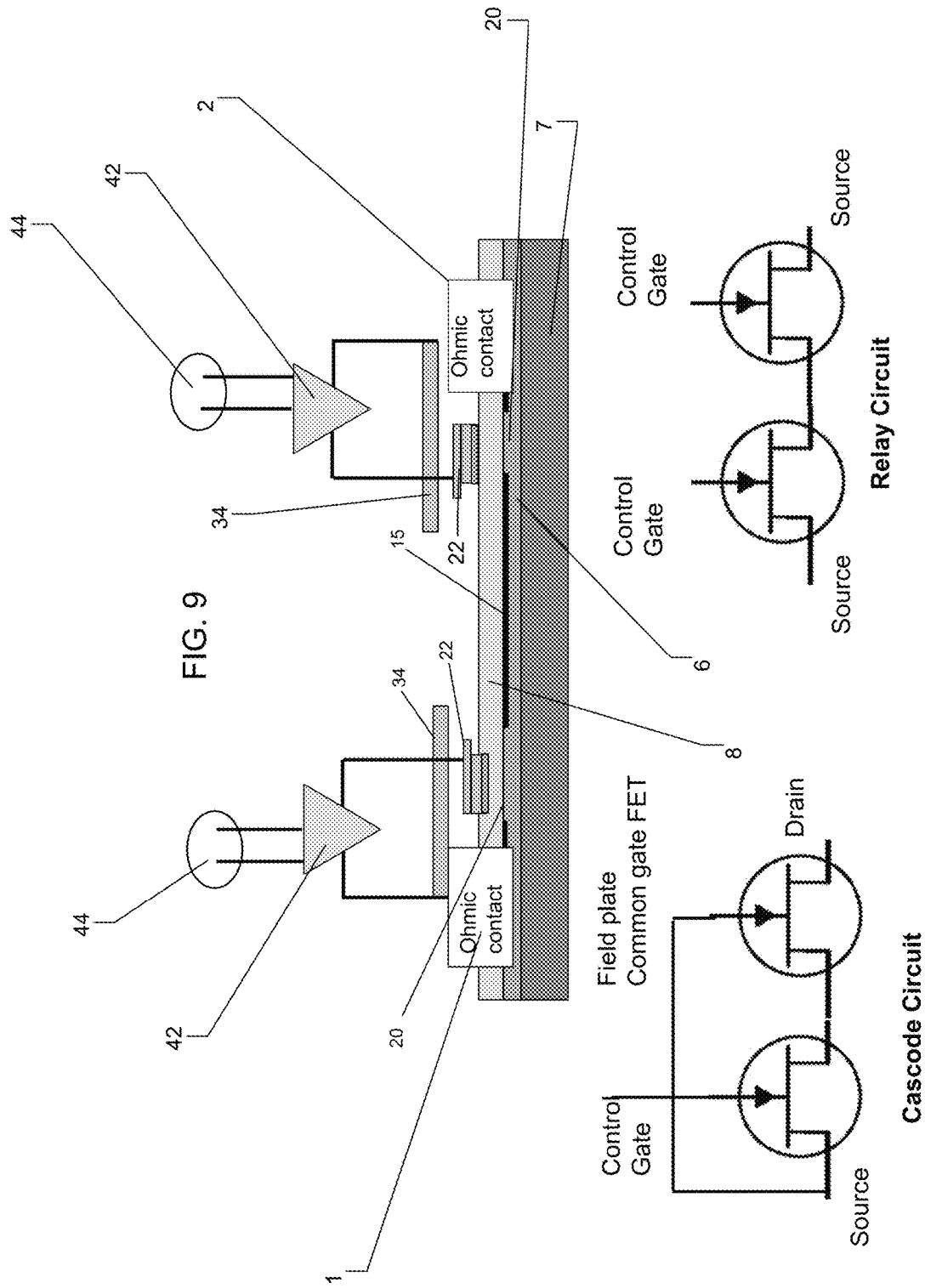

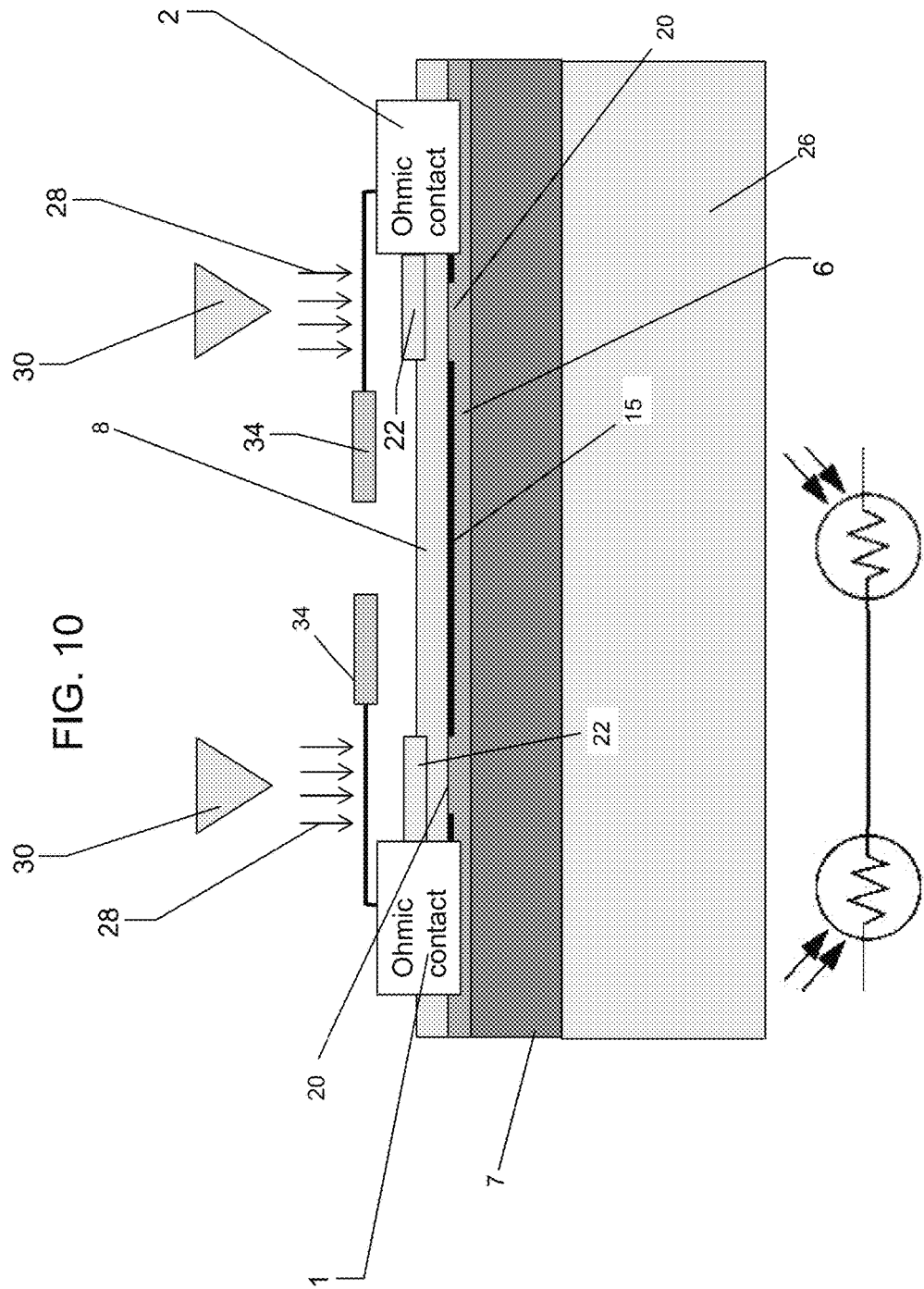

DUAL GATE III-SWITCH FOR HIGH VOLTAGE CURRENT RELAY

TECHNICAL FIELD

This disclosure relates to solid state relays, such as those actuated by light including UV, visible, IR, and other wavelengths of light, both longer and shorter.

BACKGROUND

Relays and switches can be useful for turning power on and off in response to a signal. In some embodiments, a flow of electricity can be turned on and off in response to a smaller electrical signal. Some relays and switches can be solid state devices which utilize a common drift region between the source and drain contacts and which are switched by operation of one or more gates or component switches which modify electric field(s) in the vicinity of the gate to change the conductivity of the drift region in the region of the gate.

Some solid state relays/switches, however, can require that the voltage applied to the component switches or gates be related to the voltage applied to the source and/or drain contacts, with the gate/component switch voltage being slightly higher or lower or have an opposite sign than the source/drain voltage. In applications where the voltage at the source/drain varies, the voltage of the gates would then also need to vary in relation to the voltage at the source/drain. As such, control of the gate voltage can be difficult or require a complicated and potentially expensive circuit design to provide acceptable control of the gates/component switches. As the voltages at the source/drain increase, the voltage of the control circuits also increase, and this increase in voltage of the control circuits can lead to larger circuit components, which can lead to higher capacitance within the control circuitry. Higher capacitance can in turn slow down the control circuit, and then slowdown the operation of the relay/switch. In applications where rapid switching of the relay/switch is desired or required or where rapid changes in voltage are involved, higher capacitance control circuits can be problematic as the increased capacitance can interfere with operation of the circuit at higher speeds (limits the speed). Accordingly, relays/switches with improved speed and power/voltage capability are desirable.

SUMMARY

In a first aspect, an electronic relay is provided, the electronic relay comprising a first photo-switch, a second photo-switch, and a shared drift region operationally coupled to the first photo switch and the second photo-switch.

In an embodiment of the first aspect, the first photoswitch comprises a first normally off region of the shared drift region and the second photoswitch comprises a second normally off region of the shared drift region.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive and the first and second wavelengths are substantially the same wavelength.

In an embodiment of the first aspect, one of the first and second photo-switches is a back-to-back AC high-voltage III-Nitride photo-diode.

In an embodiment of the first aspect, the first and second photo-switches are photo-diodes.

In an embodiment of the first aspect, the first photoswitch comprises a first photo-transistor.

In an embodiment of the first aspect, the first photoswitch comprises a photo-transistor and the second photoswitch comprises a second photo-transistor.

In an embodiment of the first aspect, the drift region comprises a 2-dimensional electron cloud ("2DEG").

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive, and the electronic relay further comprises a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive, and the electronic relay further comprises a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact and the first and second gates are configured to convey light incident on each respective gate to the first and second normally off region, respectively.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive, and the electronic relay further comprises a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact and the first and second gates are configured to convey light incident on each respective gate to the first and second normally off region, respectively, and the first gate is a transparent gate comprising SnO.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive, and the electronic relay further comprises a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact and the first and second gates are configured to convey light incident on each respective gate to the first and second normally off region, respectively, and the first gate conveys more than 50% of the light of the first wavelength it is irradiated with.

In an embodiment of the first aspect, the first photoswitch comprises a first normally off region of the shared drift region and the second photoswitch comprises a second normally off region of the shared drift region and when the first photoswitch is irradiated with light of a first suitable wavelength, the first normally off region becomes conductive and when light of a second suitable wavelength irradiates the second photoswitch, the second normally off region becomes conductive, and the electronic relay further comprises a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact and the first and second gates are configured to convey light incident on each respective gate to the first and second normally off region, respectively, and the second gate conducts more than 50% of the light of the second wavelength it is irradiated with.

In an embodiment of the first aspect, the relay has a switching time for switching from an off state to an on state and the switching time is less than 1000 ns.

In an embodiment of the first aspect, the relay has a switching time for switching from an off state to an on state and the switching time is less than 100 ns.

In an embodiment of the first aspect, the relay has a switching time for switching from an off state to an on state and the switching time is less than 10 ns.

In an embodiment of the first aspect, the drift region occurs at an interface of a Group III channel layer and a Group III Nitride supply layer.

In an embodiment of the first aspect, the drift region occurs at an interface of GaN and AlGaN.

In a second aspect, a method of making an electronic relay is provided where the electronic relay comprises a first photo-switch, a second photo-switch, and a shared drift region operationally coupled to the first photo switch and the second photo-switch and the first photoswitch comprises a first normally off region of the shared drift region and the second photoswitch comprises a second normally off region of the shared drift region, the method comprising forming the first and second normally off regions by one or more methods from the list consisting of recess etching the supply layer, including a P-type material in the normally off region, and including a P-type gate, where the method for the first normally off region is different from the method for the second normally off region.

In a second aspect, a method of making an electronic relay is provided where the electronic relay comprises a first photo-switch, a second photo-switch, and a shared drift region operationally coupled to the first photo switch and the second photo-switch and the first photoswitch comprises a first normally off region of the shared drift region and the second photoswitch comprises a second normally off region of the shared drift region, the method comprising forming the first and second normally off regions by one or more methods from the list consisting of recess etching the supply layer, including a P-type material in the normally off region, and including a P-type gate, where the method for the first normally off region is the same as the method for the second normally off region.

BRIEF DESCRIPTION OF THE DRAWINGS

FIG. 1 is a schematic showing contacts, a drift region and component switches.

FIG. 2 is a schematic showing one embodiment of a device disclosed herein.

FIG. 9 is a diagram showing an electronic relay.

FIG. 10 is a diagram showing a solid-state photo-conductor-relay.

DETAILED DESCRIPTION

Figure 3:
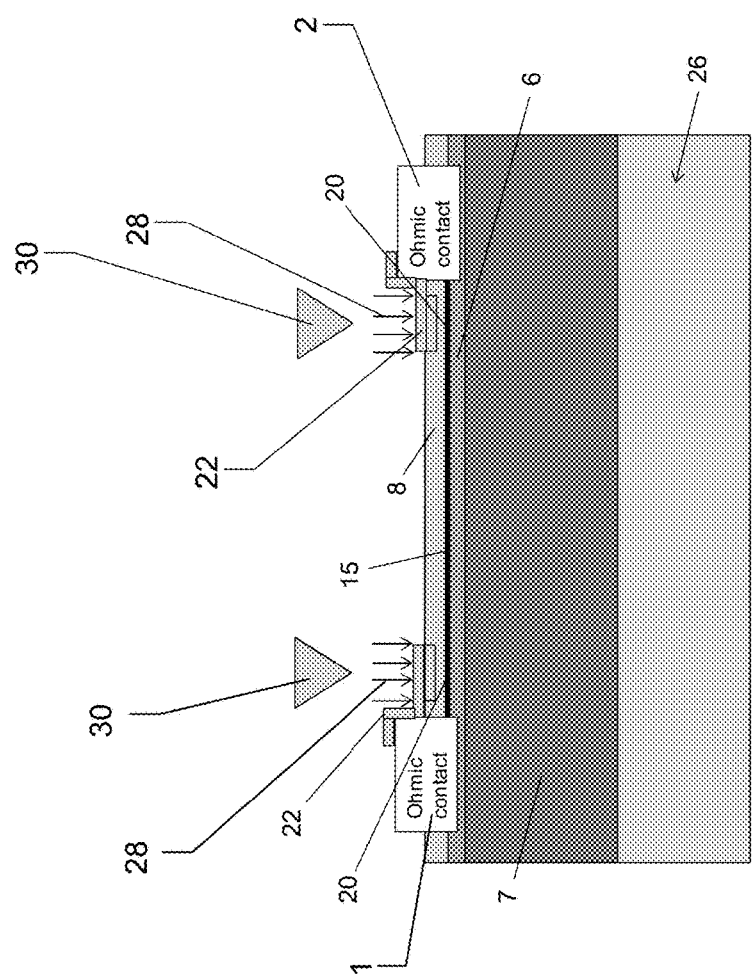
FIG. 3 is a schematic showing a second embodiment of the device disclosed herein.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Relays and switches, such as AC or DC and high voltage AC or DC switches or relays, can be made using semiconductor materials, such as a Group III Nitride material and can in some embodiments be a hetero-junction III-Nitride device and can include two component switches 3 or gates and a common drift region 5, as shown in FIG. 1. However, in some embodiments other materials such as other wider bandgap materials (e.g. SiC and diamond) or smaller bandgap materials can be used. Such devices can, in some embodiments, block high voltage in both directions between a first contact 1, or source, and a second contact 2, or drain, when off and can conduct in both directions, while using the same drift region, when on. The component switches or gates can comprise photoconductors, photo-diodes, Schottky diodes, and/or P-N diodes.

In some embodiments, a device as described herein can share features with a normally-off high electron mobility transistor (HEMT), such as a III-Nitride HEMT, and also include features different from a normally-off high electron mobility transistor. One embodiment of a switch or relay is shown in FIG. 2. In FIG. 2, a drift region (5) extends between contacts (1 and 2) and is located between a supply layer (8) and a channel layer (6), which is located above an insulating buffer layer (7). First and second component switches (3) interrupt the drift region (5) between the first and second contacts (1, 2).

Figure 5:
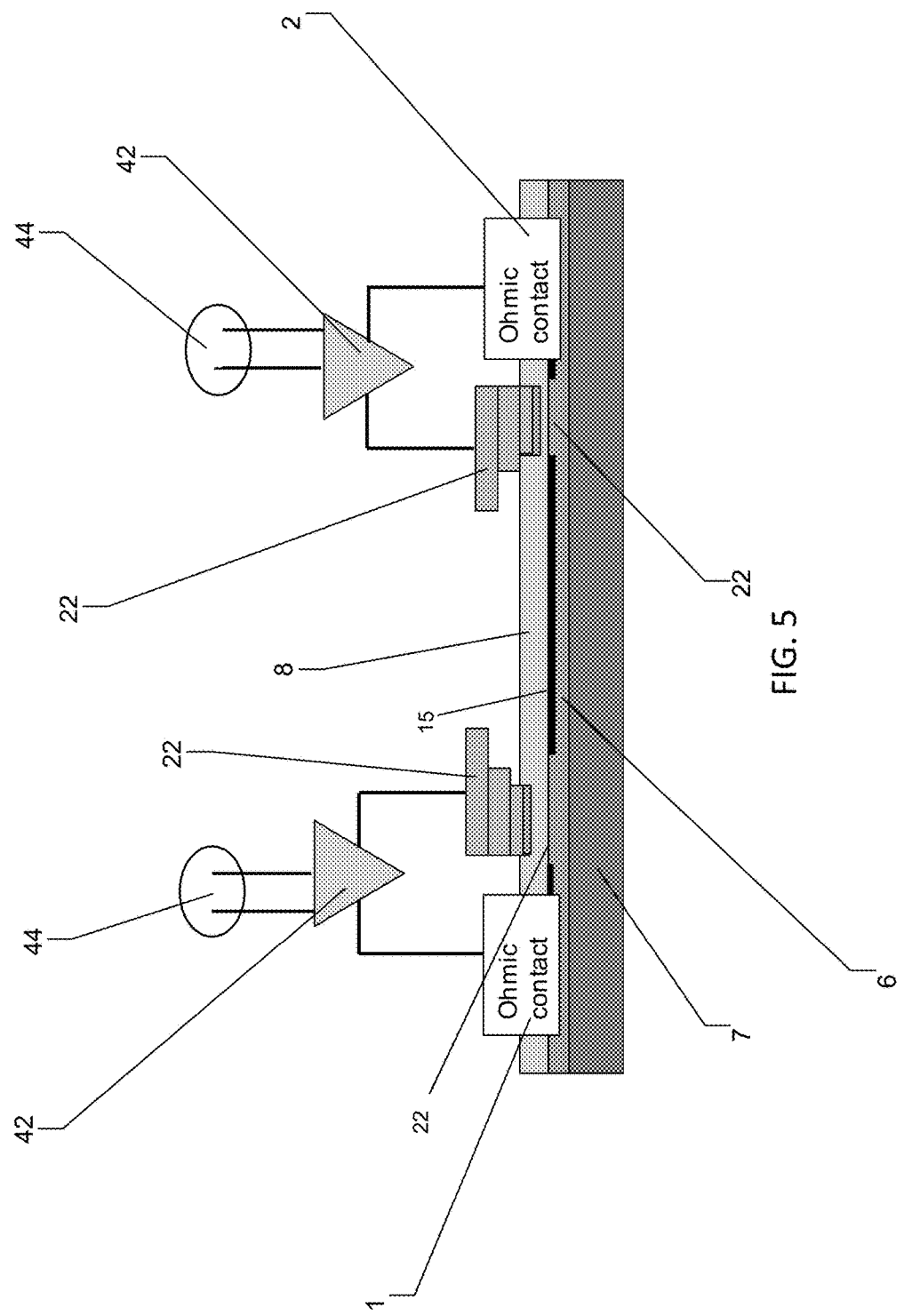
FIG. 5 is a schematic showing a device with floating gate drive.

In some designs, a floating gate drive 42 can be utilized to provide greater control over the switching characteristics of the relay or switch, such as is shown in FIG. 5. Here a normally open region 22 is located adjacent to each ohmic contact 1, 2, with a low resistance 2DEG 15 extending between the normally off regions 22. The 2DEG is located between a supply layer 8 and a channel layer 6, with the channel layer 6 located on an insulated buffer layer. Optionally, the buffer layer can be located on a substrate layer 26. In operation a floating gate control 42 is operationally connected to an ohmic contact 1,2 and a corresponding gate 22. Separate isolated control and bias 44 are provided to the floating gate control 42.

In some embodiments, a photo-optically controlled relay or switch can simplify the control of the relay or switch and can provide the ability to switch high power or high voltages at high speeds.

Frequently, the choice of solid state relay can be related to the switched voltage. In some situations, a wide bandgap material can be advantageously used to support a large switched voltage in a smaller distance or device size. The small distance reduces the on-resistance of the switch. The energy of the light for switching the relay can be larger than the bandgap of the material. As such, various wavelengths of light can be used with various choices of material and device parameters, such as path length. Some combinations of materials can provide higher performance. Some combinations of materials can provide lower cost. Some combinations of material can face trade-offs between cost and performance.

In one embodiment, a solid state relay or switch can comprise a drift region 5 which includes a photo switchable normally off region in the channel layer associated with each of one or more component switches 3 or gates 40. In some embodiments, all of the component switches 3 or gates 40 can be associated with photo switchable normally off regions 20 and in some embodiments only a portion of the component switches 3 or gates 40 can be associated with photo switchable normally off regions 20, and in some embodiments, at least a portion of the component switches 3 or gates 40 are associated with regions which do not have photo switchable normally off regions 20.

In some embodiments, a flow of electricity can be turned on and off in response to a radiation signal, such as a light signal. For example, power can be turned on when the relay is radiated with the proper wavelength of light, or power can be turned off when the relay is radiated with the proper wavelength of light. In some embodiments, electrical flow can be one directional and in some embodiments electrical flow can be bidirectional. In some embodiments, AC power can be switched and in some embodiments DC power can be switched while in some embodiments either AC or DC power can be switched.

In one embodiment, the common drift region can be a low resistance two dimension electron gas (2DEG) 15, and ohmic contacts 1, 2 can connect to a low resistance 2DEG 15 between the ohmic contacts 1, 2. In one embodiment, there can be a normally-off region 20 near one or more ohmic contacts 1, 2. In another embodiment there can be two ohmic contacts 1, 2 and there can be a normally-off region 20 near one or both ohmic contacts 1, 2. The normally-off region 20 can be made by methods including, but not limited to, recess etching an AlGaN supply layer, P-type implant, P-type Gate.

In one embodiment, as shown in FIG. 3 where an on-switch state is shown, ohmic contacts 1, 2 connect to a low resistance 2DEG 15 between them. There is a normally-off region 20 near each ohmic contact 1, 2. Both normally-off regions 20 can have a gate such as a transparent gate 22 conductively tied to their adjacent ohmic contact 1, 2. The device can be configured for light to generate charge carriers in the normally-off regions 20 to turn on the device. In some embodiments, the channel region 6 material bandgap can be configured to absorb UV or some other wavelength of light (e.g. IR, visible, near IR, extreme UV, vacuum UV, UV A, UV B, UV C, deep UV, etc.) light and generate electrons and turn on the device. In some embodiments, the channel region 6 material is selected to have a high block or breakdown voltage A switch can have a high block or breakdown voltage (BV), and a low product of on-resistance ($R_{on}$) and area (Area). The Baliga figure of merit (BFOM) for a switch is $BV^2/(R_{on}*Area)$, which in theory can be higher for higher breakdown field ($E_c$), higher dielectric ($\varepsilon$) and/or higher mobility ($\mu$), materials:

$$BFOM = \frac{V_B^2}{R_{On} \cdot A} = \frac{\varepsilon \cdot E_c^3 \cdot \mu}{4}$$

Generally, the breakdown field can increase with increasing bandgap of the materials used. Accordingly, semiconductors such as GaN and SiC, having higher bandgap have a higher breakdown field than Si, but cost more than Si. Further, hetero-structures in GaN can produce a 2DEG, which can allow GaN to have high electron mobility to reduce on-resistance.

To make a low resistance photo-conducting region in a switch, which can turn-on and off quickly, a direct bandgap material can be desirable. Examples of direct bandgap materials include most III-V semiconductors.

In some embodiments, a lateral switch can be used. Examples of lateral switches are shown in FIG. 3 (on-state) and 4 (off-state.) A lateral switch can utilize two gate 22 regions with a common drift region 5 such as for an AC switch. The common drift region 5 can reduce $R_{on}$. In some embodiments, a lateral device can simplify illuminating the gate region as compared to a vertical switch.

In some embodiments, a vertical switch can be used. Vertical switches are preferred for many high voltage application (e.g., >1200V). The device can be a vertical column of semiconductor etched down to a conductive substrate. The contacts can be on top of columns and can be on the back of the conductive substrate. The column can include photo-conducting regions at the top and/or bottom, and can have a common drift region between the photo-conducting regions. The light for turn-on on the photo-conductive region can come in from the sides of the columns. In some embodiments, a quasi-vertical switch can be used, as explained below.

Representative materials for the supply layer include AlGaN. Representative materials for the channel layer include GaN. Although other combinations of materials can be used, such as those having appropriate lattice parameters and band gaps to form a 2DEG. Representative materials for the substrate include Si, SiC, GaN, and $Al_2O_3$ (e.g. sapphire). Representative materials for the insulating buffer layer include GaN and AlGaN. Representative materials for the ohmic contacts include Au, Ni, and Al. In some embodiments, particular combinations of materials can be advantageous. For example, a supply layer-channel layer combination having a low sheet resistance (e.g. high sheet carrier concentration and high carrier mobility) are desirable. In addition, a buffer layer and substrate layer can be chosen to support the switching voltage and to have low thermal resistance and low cost. Ohmic materials can be chosen for low contact resistance and low cost.

The channel layer 6 can be modified in the gate region to have no carriers, such that the switch can support the switch voltage. In various embodiments, this modification can include etching away part of the supply layer, doping the supply or channel with p-type dopant, and/or modifying the stress between the supply and channel layer to reduce piezo electric charge. In some embodiments, the structure may be modified to increase the absorption of light, including an anti-reflection coating for the gate region.

In some embodiments, the normally off region 20 and/or portions of the relay/switch in functional communication with the normally off region 20 can be configured to include photosensitive material that can generate current carriers in the normally off region 20 when irradiated with control light of a suitable wavelength.

In some embodiments, the normally-off region(s) 20 can have a gate conductively 22 connected to their adjacent ohmic contact(s). In some embodiments, one or more field plates 34 can be used in place of or in conjunction with one or more of the gates 22, with the use of field plates 34 being assessed separately for each gate 22.

Power MOSFET switches can operate with a gate region that is turned off, as the drain voltage increases the carriers in the drift region are depleted, and the depleted region supports the increasing drain voltage. The invention operates under similar principles. When the photo-conducting gate is off, the drain voltage depletes the carrier from the drift region 5. For some lateral devices, the electric field can increase rapidly near the gate 22, resulting in lower breakdown voltage. For some applications, the source field plate 34 can help to make the electric field more uniform and increase the breakdown voltage. The field plate region can be modeled as a common gate FET in series with the common source FET which has the control gate. In some respects and in some embodiments, the device can be modeled as a Cascode circuit, as shown in FIG. 9. In some respects and in some embodiments, the device can be modeled as a Relay circuit, as shown in FIG. 9. When the common source FET is switched off, and a drain voltage applied, the voltage at its drain increases. This node is also the source of the common gate FET. When the node voltage exceeds the pinch of voltage of the common gate FET, the common gate FET switches off, and the majority of the switch voltage drop across the common gate FET. The long gate length common mode FET (source field plates) has a large breakdown voltage. A MOSFET with field plates 34 and floating gate drive 42 is shown in FIG. 9 with ohmic contacts 1, 2, normally off regions 20, gates 22, 2DEG 15, and floating gate drive 42. The floating gate drive can have an isolated control and bias 44.

The control region can be a conventional FET with electronic gate control, but it can also be a photo controlled conductor or diode as in FIG. 10, where light 28, such as UV light, from a light source 30 irradiates a normally off region 20, where the light 28 passes through, around or beside a gate or transparent gate 22 connected to an ohmic contact 1, 2 and the light 28 also passes through, around or beside a field plate 34. FIG. 10 also shows a channel and UV absorption layer 6 to generate charge carriers, a 2DEG 15, a substrate 26 and an insulating buffer layer 7. In some embodiments, the device can be modeled as two photoresistors connected in series.

In some embodiments, the ohmic contact 1,2, gate 22, field plate 34 and normally off regions 20 can be configured to allow control light to irradiate the normally off region 20. In one embodiment, the gate 22 material and/or field plate(s) 34 can be transparent or partially transparent to the control light and can allow control light to reach the normally off region 20 and/or the photo sensitive material. In one embodiment, one or more of the gate 22, field plate(s) 34, ohmic contact 1, 2, substrate 26, buffer layer 7, channel layer 6 can be configured to allow light to be conveyed to the photosensitive material and/or normally off region 20 such as by creating openings in one or more of the gate 22, field plate(s) 34, ohmic contact 1, 2, substrate 26, buffer layer 7, and channel layer 6, gaps between any two or more of these parts, gaps adjacent to one or more of these parts, relative positioning of parts or providing light channels to the photosensitive material, as well as combinations of these techniques.

In some embodiments, the control light 28 can be UV light or can comprise UV light, or can be or comprise light of a different wavelength that is capable of interacting with the photosensitive material to form charge carriers in the in the normally-off region to turn on the switch/relay. In various embodiments, the photosensitive material can be a part of the channel region of the relay/switch and the photosensitive material bandgap can be designed to absorb e.g. UV light and generate charge carriers such as electrons, or the photosensitive material bandgap can be designed to absorb another appropriate wavelength of light and generate charge carriers such as electrons.

Operation

Figure 4:
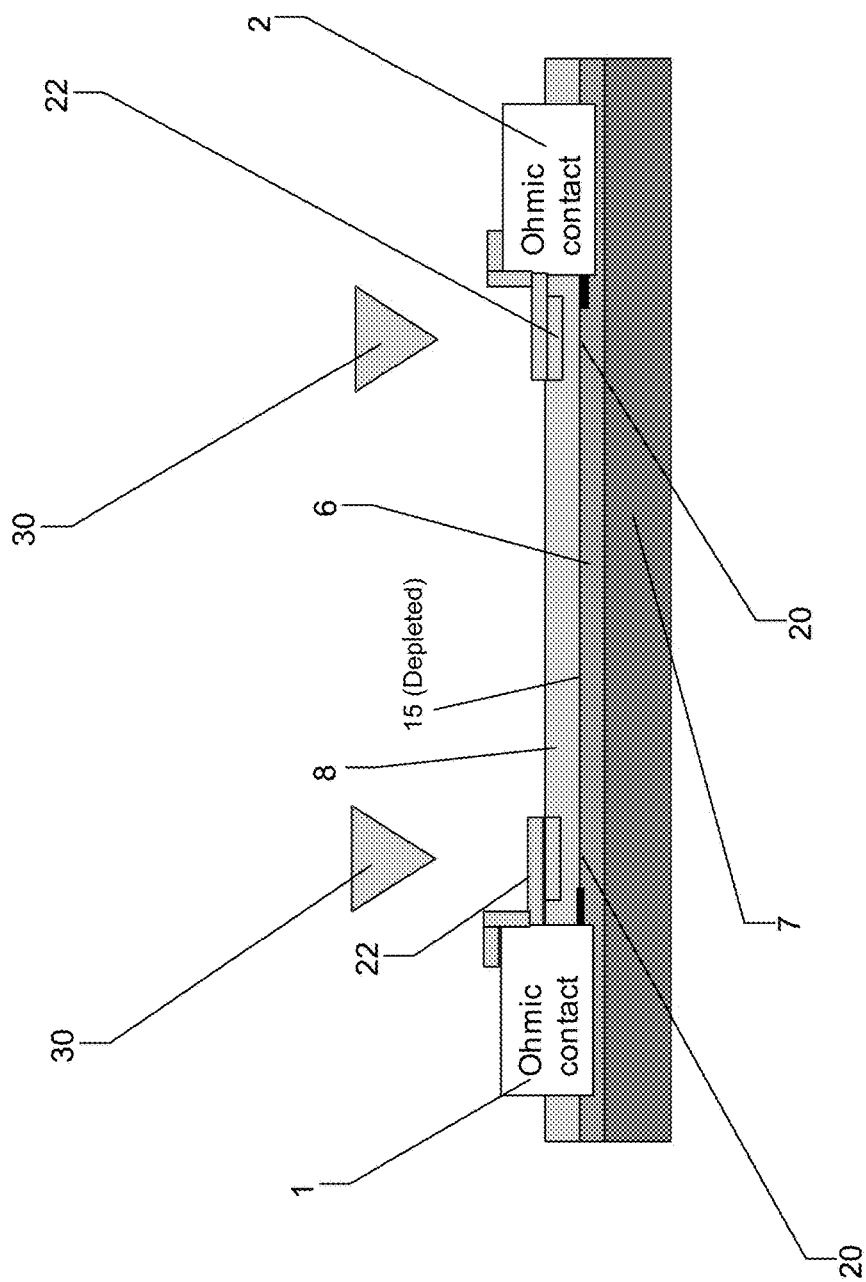
FIG. 4 is a schematic showing a depleted 2DEG.

When the control light 28, e.g. UV light, is turned off or is sufficiently attenuated, the charge carriers, such as electrons, in the normally-off region or regions can rapidly disappear, such as by charge holes drifting to an ohmic contact 1, 2 and/or recombining with electrons, returning these regions to the normally-off state. When a device such as the device shown in FIG. 4 is used as a switch or a relay, and not irradiated, ohmic contacts 1, 2 are energized and one of the gates 22 will be at a reverse bias as compared to the other. The conductive gates 22 tied to their adjacent ohmic contacts 1, 2 can keep at least a portion of the 2DEG 15 depleted of charge carriers, and in an "off" state when a high voltage reverse gate bias is applied on the second ohmic 1, 2. When a high positive voltage is applied to the right hand ohmic 2, for example, with respect to left hand contact 1, the left hand normally-off region 22 can block the current and the voltage can deplete the 2DEG 15 toward the right hand ohmic 2 allowing the switch to hold a high voltage without breaking down. When the applied voltage is negative, the right hand normally-off region 20 can block the current and the voltage can deplete the 2DEG 15 toward the left hand ohmic. In some embodiments, the switching time from "off" to "on" and/or from "on" to "off" can be fast compared to pn devices. In some embodiments, the switching time from "off" to "on" can be less than 2000, 1000, 500, 200, 100, 50, 20 or 10 ns.

In another embodiment, a via 35 can be made through the substrate to one or more of the ohmic contacts, to provide an alternate way of connecting or interconnecting relays/switches to one another or to other external components. In some embodiments, a via 35 made to one or more of the ohmic contacts 1, 2, such as through the substrate 26 and buffer layer 7 can be used to modify the device into a quasi-vertical switch/relay, such as in FIG. 6. In some embodiments, vertical devices and quasi-vertical devices and can be advantageous such as by allowing easier paralleling of multiple devices for lower conduction loss and operation with higher current without the complications of high voltage lines crossing one another or portions of a device that can be affected by an electrical field.

In some embodiments, a via 35 or combination of vias 35, alone or in combination with conducting paths can be used to make a device with a light pathway to the photosensitive material on one side of the device and connection between an ohmic contact 1, 2 and a gate 22 or field plate 34 that does not block the light path, such as by routing a conducting path internally to the device or along a different side of the device.

Production

The device described herein, such as those made with III-Nitride can be made economically and can be grown on any suitable substrate. Suitable substrates 26 include, but are not limited to materials such as a Si substrate and can include other known materials, and can be any size desired, for example, 3 to 8 inches in diameter, or larger or smaller, and can be made in in some embodiments in a simple manufacturing process with few masks. In some embodiments, III-Nitride LEDs, lasers can be used as a control light source, and can be used to provide UV light. In some embodiments, commercially available LEDs, lasers and OLEDs can be used.

In some embodiments, various parameters can be varied in the design and/or manufacture of devices described herein. For example, the distance between the normally-off regions 22 can be varied, resulting in devices having different maximum switching voltages. Such a change can be accomplished, for example, during a lithography step.

In some embodiments, the thickness of an insulating buffer layer 7 can be varied to change the maximum voltage of the device. In some embodiments, a buffer layer 7 can support a voltage of about 300V/μm. In some situations, it can be desirable to limit growth of some layers to a particular depth such as 5 μm, but in some embodiments growth can be to a different depth, such as 2, 3, 4, 6, 7, 8 μm or more. For example, under some circumstances a III-Nitride layer thicker than about 5 μm can be difficult to achieve because of mechanical stress in the layer. In some embodiments, an additional material, such as an insulating substrate can be added to or substituted for an Si substrate 26 on the backside of the insulating buffer layer 7. In some embodiments, such an insulating substrate can be beneficial for high voltage operation, such as with voltage approaching or exceeding 1000V. In some embodiments, an insulating substrate 26 can be used such as for high voltages with a buffer too thin to support the higher voltage. In some embodiments, a switch can be present on a substrate 26 having high thermal conductivity, such as an insulating high thermal conductivity substrate, rather than Si. In some embodiments, a switch can be made utilizing an Si substrate 26, but where the Si substrate 26 is removed and the switch or portion of a switch is transferred to a substrate such as a high thermal conductivity substrate 26 or an insulating substrate 26 with high thermal conductivity. In some situations, such an insulating high thermal conductivity substrate can allow the production of the switch on a substrate that does not support the anticipated switching voltage of the device. In some embodiments various combinations can be used in the design, such as varying distances or dimensions in the design, thickness of insulating buffer layers, and use of an insulating substrate 26 in addition to or as a replacement for a Si substrate 26 can be used.

In some embodiments, a Si substrate 26 can be absent. Absence of a Si substrate 26 can be beneficial in some embodiments, for example, to reduce thermal resistance. In some embodiments, such as where a device is used as a high current switch or relay, one or more of these devices can be attached to an insulating substrate and can be connected in parallel, when more than one is present. The device or devices can also be spaced apart from each other to, for example, facilitate heat removal from the devices or for other reasons as well.

In some embodiments, it can be advantageous for a device to limit a surge or transient current, such as a surge current when a device is initially turned on or when the device switches state between off and on. In some embodiments, a device can utilize materials and be designed to limit a surge current by limiting the number of charge carriers. In some embodiments, the control light can be varied to control the number of charge carriers, such as be varying the intensity of the light. In some embodiments, the number of charge carriers can be less than that of a p-n device in order to limit the surge current through the device. In some embodiments, devices described herein can be operated at elevated temperature, such as at >100° C., or >150° C., or >200° C., or >220° C., or >240° C., or >250° C., either for short periods, such as during surge conditions or during sustained operation. In some embodiments, a device can be capable of limiting a surge current while operating at an elevated temperature, as described herein, and can be capable of allowing operation at higher power than a p-n device. Frequently, this temperature can be higher for wide bandgap material, such as in some cases about 200° C. for GaN, and in some cases about 125° C. for Si pn diodes. For short period, such as during surge, the temperature may safely go to higher temperatures. In some such situations, the maximum temperature can then be set by changes in the switch at high temperature, such as melting the ohmic contacts. In some embodiments, a device utilizing III-Nitride can be used to operate at elevated temperatures, such as described herein, allowing significantly higher power during switching transients without damaging the device. In some devices, such as where back-to-back switches form a relay, the surge current can be controlled by using the gate voltage to limit the number of charge carriers.

In some embodiments, surge or transient current can be limited by cycling the device between off and on states, such as by changing the control light between off and on, at a rate that limits the maximum current delivered during a transient event.

Materials

In some embodiments, the device or relay can utilize a material with a high breakdown field, such as III-Nitrides materials including, but not limited to wide bandgap materials such as SiC and diamond and others. In some embodiments, the device can utilize a material or combination of materials with high electron mobility, such as those which can form a two dimensional electron gas (2DEG), such as a III-Nitride including but not limited to AlGaN/GaN, AlN/GaN, AlN/AlGaN, AlGaAs/InGaAs, and AlGaAs/GaAs. In some embodiments, devices utilizing such materials can be used to make a high voltage/low resistance switch or relay.

Suitable materials include those used in the construction of hetero-junction III-Nitride devices, such as those utilizing a Group III Nitride channel and light absorption layer and a Group III Nitride supply layer layered over a suitable substrate and buffer layer. In some embodiments, the Group III Nitride channel layer can be a GaN channel and light absorption layer, such as a GaN channel and UV absorption layer, and in some embodiments, the Group III Nitride supply layer can be an AlGaN supply layer. However additional materials for the channel layer can include materials such as a III-Nitride including but not limited to AlGaN/GaN, AlN/GaN, AlN/AlGaN, AlGaAs/InGaAs, and AlGaAs/GaAs. However, in some embodiments, alternate materials such as other Group III-V compound semiconductors (e.g. one or more Group III elements such as Al, Ga and In combined with one or more Group V elements such as N, P, As, and Sb), SiC, diamond, AlN and other insulators can be used. In some embodiments, direct bandgap materials can be preferred and can provide low channel resistance and can be suitable for generating charge carriers upon irradiation with suitable wavelengths of light.

In various embodiments, such as shown in FIGS. 3-10, the insulating buffer layer 7 can include materials having a sufficiently close lattice match to the channel and supply layers, such as GaN, AlGaN and InAlN, the channel layer 6 can be a GaN channel and UV absorption layer, and the supply layer 8 can be an AlGaN supply layer. However other materials can be used as well, such as InAlN as well as other materials used for similar but non-photo controlled devices. In some embodiments, variations in the buffer layer can be used to accommodate differences in lattice match such as by grading or using a super-lattice structure for the substrate, for example by providing alternating layers of GaN and AlGaN or other suitable materials.

The substrate 26 generally does not need to be lattice matched to the epitaxial supply/channel layers 8, 6, however, with homo-epitaxy devices, such as with a GaN substrate, lattice matching the substrate 26 can be advantageous.

In some embodiments, the entire channel layer 6 can be photosensitive so as to generate charge carriers upon irradiation by a suitable light source. In some embodiments, only a portion of the channel layer 6 includes photosensitive material which is sensitive to the wavelength of light being used to control the relay/switch. In some embodiments, the photosensitive material can be incorporated into the normally off region 22 or it can be adjacent to or in contact with the normally off region 22.

In some embodiments, the photosensitive material can be generated through doping of the material used for another portion of the device, such as by doping at least a portion of the channel layer to modify the photosensitivity of that portion of the channel layer 6. In some embodiments, incorporation of the photosensitive material can be by way of deposition of the material onto the structure or by reaction of a material previously deposited on the structure or by a combination of deposition and reaction.

In some embodiments, two or more different photosensitive materials can be used on device. In one embodiment, one material can be used to switch one normally off region 22 and a different material can be used to switch a different normally off region 22 on the same device. In another embodiment, the photosensitive material used to switch one normally off region 22 can comprise two or more photosensitive materials and in some embodiments the two or more photosensitive materials can respond to the same, substantially the same or different wavelengths of light.

Suitable dopants can include fluorine and magnesium. Suitable reagents/processes can include wet etching, plasma (dry) etching, atomic layer etching, ion milling and the like. Suitable deposited material can include materials which increase surface potential or reduce the effective positive charges density at the surface, and can include poly crystalline AlN and other materials which provide this effect.

In some embodiments, a material in the gate region can be etched away and a new material grown in the gate regions which provides the photo sensitivity desired. The new material can be wide band gap material or material having a narrower band gap. In some embodiments, a narrower band gap material can be utilized with field plates which can initiate depletion of the drift region before breakdown of gate region. Suitable narrower band gap materials include InGaN, GaAs.

Field plates 34 can include those known to those skilled in the art, and in particular designs can include those comprising or consisting of one or more metals, and be dimensioned and/or located (e.g. laterally, longitudinally, vertically) to control the electric filed under the plates 34 such as to form a conductive pathway. In some embodiments, the field plate 34 can be designed to increase the device breakdown voltage. In some embodiments, one or more field plates 34 can be dimensioned in relation to a normally-off region 22 in proximity to the field plate.

Transparent gates, contacts or field plates can be constructed of a material that allows a sufficient amount of light to pass through the gate, contact or field plate so as to generate enough charge carriers in the normally off region to allow a current flow through the normally off region or to provide enough charge carriers when combined with the field generating/modifying properties of the gate, contact or field plate to provide for a current to flow through the normally off region.

In some embodiments, a transparent gate, contact or field plate can be made of a material which allows light of a suitable wavelength to pass through the gate, contact or field plate. In some embodiments, suitable materials can include metals, oxides, ceramics, glasses, semiconductors (undoped and doped) and the like as well as combinations thereof.

In some embodiments, suitable materials can include materials which are normally considered opaque or reflective, but which are prepared sufficiently thin so as to allow light of a suitable wavelength to pass through the gate, contact or field plate at a sufficient intensity so as to generate enough charge carriers in the normally off region to allow a current flow through the normally off region or to provide enough charge carriers when combined with the field generating/modifying properties of the gate, contact or field plate to provide for a current to flow through the normally off region. Suitable materials can include those which are malleable and/or can be mechanically worked to a sufficient thinness. In some embodiments, heating can be used in conjunction with the working of the material. Suitable materials can include gold, silver, platinum, copper, aluminum led, tin, iron and nickel as well as related materials, such as by reference to the periodic table groups and can also include combinations of these.

Suitable materials can also include those which can be formed in a sufficiently thin layer such as by various deposition techniques including physical vapor deposition, chemical vapor deposition, electrochemical deposition, molecular beam epitaxy and atomic layer deposition.

In some embodiments, the material used for the transparent gate, contact or field plate can be a metal or another material having electrical properties suitable for a gate, contact or field plate, such as conductivity, and can include appropriate ceramics, oxides and semiconductor materials, either doped or undoped. In some embodiments, the material can have inherent properties of being able to conduct an appropriate wavelength of light, such as tin oxide, indium tin oxide, fluorine doped tin oxide, doped zinc oxide, or other transparent conductive oxides. Additional materials can include carbon-based materials such as graphite, ordered two-dimensional carbon compounds, such as graphene, as well as derivatives, precursors and combinations thereof. In some embodiments, the material can be a combination of any of these described.

In some embodiments, the material used for the transparent gate, contact or field plate can be present on a substrate or support of a suitable material and design to allow sufficient light to pass. Such substrate or support can be solid, porous, have channel, etc. The transparent gate, contact or field plate can be formed on the substrate or support or affixed to the substrate or support.

In some embodiments, the transparent contact, gate or field plate can be configured to allow more than 5%, 10%, 15%, 20%, 25%, 30%, 35%, 40%, 45%, 50%, 55%, 60%, 65%, 70%, 75%, 80%, 85%, 95%, or more of the incident light of a suitable wavelength to be transmitted to the normally off region.

In some embodiments, the gate/contact/field plate can include an antireflective coating or coating system on a surface of the gate/contact/field plate, such as one which comprises a material having a dielectric constant/index of refraction selected for the gate/contact/field plate material, the environment above the surface and the environment/material below the gate/contact/field plate and the wavelength(s) of light being used. In some embodiments, suitable materials can include SiN, $SiO_2$, $Al_2O_3$, $MgF_2$ and others known in the art, and can be applied in a thickness suitable for achieving reduced reflection.

In some embodiments, a pattern can present on or applied to the surface. Patterning can reduce reflection and/or increase transmission of light through the gate/contact/field plate. Suitable patterning includes subwavelength gratings, conical subwavelength gratings, and others as can be understood by one of skill in the art. In some embodiments, the patterning can include a series of slits, a series of pits or a series of peaks, as well as combinations thereof. In some embodiments, patterning can be included on the material for the gate/contact/field plate. In some embodiments, patterning can be included on a material used for a coating or a coating system or an antireflective coating or coating system. In some embodiments, the patterning can provide thick regions and thin regions, wherein the thin regions are sufficiently thin to allow passage of a sufficient amount of light to allow operation of the device such as by allowing sufficient light to pass to the normally off region to generate sufficient charge carriers in the normally off region and either alone or in combination with the field generating/modifying properties of the gate, contact or field plate, to provide for a current to flow through the normally off region.

Formation of Normally Off Regions

The normally off regions 22 can be formed in the supply layer 8 and/or the channel layer 6 by any suitable method. Suitable methods include, but are not limited to those which remove material and those which add material, such as by recess etching the supply layer, including a P-type implant, including a P-type gate. In some embodiments one method could be used for one normally off region 22 of a device and a different method used for a different normally off region of the same device.

Light Sources

Various light sources 30 and wavelengths of light 28 can be used for providing control light to the device. In some embodiments, a light source 30 can be one or more LEDs, OLEDs, lasers, incandescent, fluorescent, spark, arc or other types of light sources such as due to a chemical reaction, a nuclear reaction or from natural sources such as sunlight or coronal mass discharge or interaction of energy or particles with the atmosphere such as the ionosphere.

Suitable wavelengths of light include those which can cause the photosensitive material present on the device to generate charge carriers. In some embodiments, the light can be monochromatic and in some embodiments, the light can be polychromatic. Embodiments of particular wavelengths include ultraviolet, x-ray, visible, infrared, and radio. In some embodiments, particular wavelengths which are suitable for interacting with the photosensitive material to generate charge carriers can be mixed with other wavelengths which are not suitable for generating charge carriers from the photosensitive material.

In some embodiments, a light source 30 can be selected for a particular photosensitive material. In some embodiments, the photosensitive material can be selected for a light source that is present or available.

In various embodiments, the light source 30 can be capable of producing a wavelength of about 400 nm to about 500 nm or about 425 nm to about 475 nm or about 450 nm to about 500 nm or about 400 nm to about 450 nm, such as when a GaN photosensitive material is used. In some embodiments, a III-nitride laser can be used as the light source 30.

In some embodiments, a light source 30 can be used directly, such as by directing the discharge of a laser or the discharge of an LED or OLED onto an appropriate region of the device. In some embodiments, a single light source 30, such as a single laser, LED, OLED or other source can be directed onto multiple relays/switches or onto multiple points on a single relay/switch such as through use of a beam splitter, waveguides or optic fibers, etc. and combinations thereof.

In some embodiments, a light source 30 can be focused, so as to intensify light 28 impinging upon a point of the device/relay or the light can be diffused.

In some embodiments, multiple beams can be directed onto a single point of the relay/switch.

In some embodiments, various combinations of focusing, diffusing, directing onto multiple points and collecting multiple beams into a single point can be used as desired.

Control of Light Sources

In some embodiments, the control light 28 can itself be controlled, such as by energizing, de-energizing and/or partially energizing or de-energizing the light source 30. In some embodiments, the light source will have an "on state" and an "off state." In some embodiments the light source 30 can also have one or more additional states wherein the light source emits a changeable range of intensities or a changeable range of wavelengths of light.

In some embodiments, the light source 30 can be controlled by an external modulator. Examples of modulators include those utilizing polarizing grids, LCDs, shutters, etc.

and can include spatial light modulators, electrically addressed spatial light modulators, and optically addressed spatial light modulators.

In some embodiments, a plurality of relays/switches can be simultaneously or near simultaneously switched by utilizing a single light source 30 configured to deliver light to each of the plurality of release/switches, such as by utilizing one or more of a beam splitter, waveguides, optic fiber, etc.

Additional Designs

Figure 6:
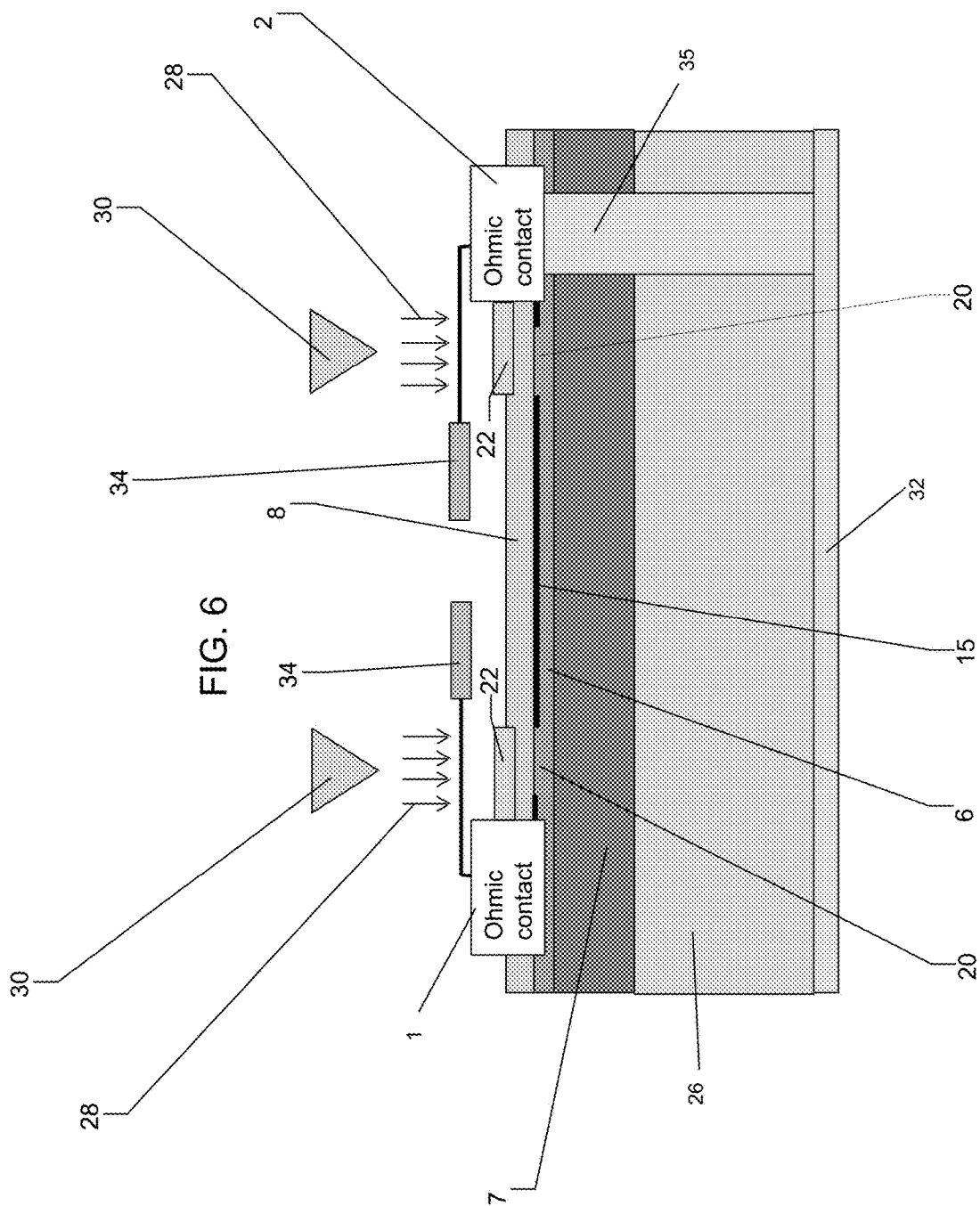
FIG. 6 is a diagraph showing a quasi-vertical device.

In some embodiments, devices described herein can be made as a quasi-vertical device, for example with a via 35 through the substrate 26 to one of the ohmic contacts 1, 2, as in FIG. 6. In FIG. 6, one ohmic contact 2 includes a via 34 including a conductor such as a metal which conductively connects the contact 2 to a backside contact 32. However, a different ohmic contact, such as ohmic contact 1 can be conductively connected to a backside contact 32 by a via 34. In addition, FIG. 6 shows a gate 22, such as a transparent gate 22 functionally located in relation to a normally open region 20 proximate each of the contacts 1,2. Optional field plates 34 are also shown extending past the gates 22. The field plates 34 are connected to the contacts 1,2 such that light 28 can pass from a light source 30 to the normally open region 20 where charge carriers can be generated by the light. In various embodiments, the connection between the field plates 34 and the contacts 1,2 can be transparent or include a light path through or around the connection, such as by providing one or more wave guides or openings or light pathways through or around conductors. In various embodiments, the gates 22 can be transparent or include a light path through or around the connection, such as by providing one or more wave guides or openings or light pathways through or around conductors. Vertical devices and quasi-vertical devices can allow paralleling multiple devices for lower conduction loss and higher current with fewer complications of routing high voltage lines and can reduce or prevent the number of high voltage lines crossing one another. In some situations, a vertical or quasi-vertical device can be advantageous due to space constraints within a system that includes the device.

Figure 7:
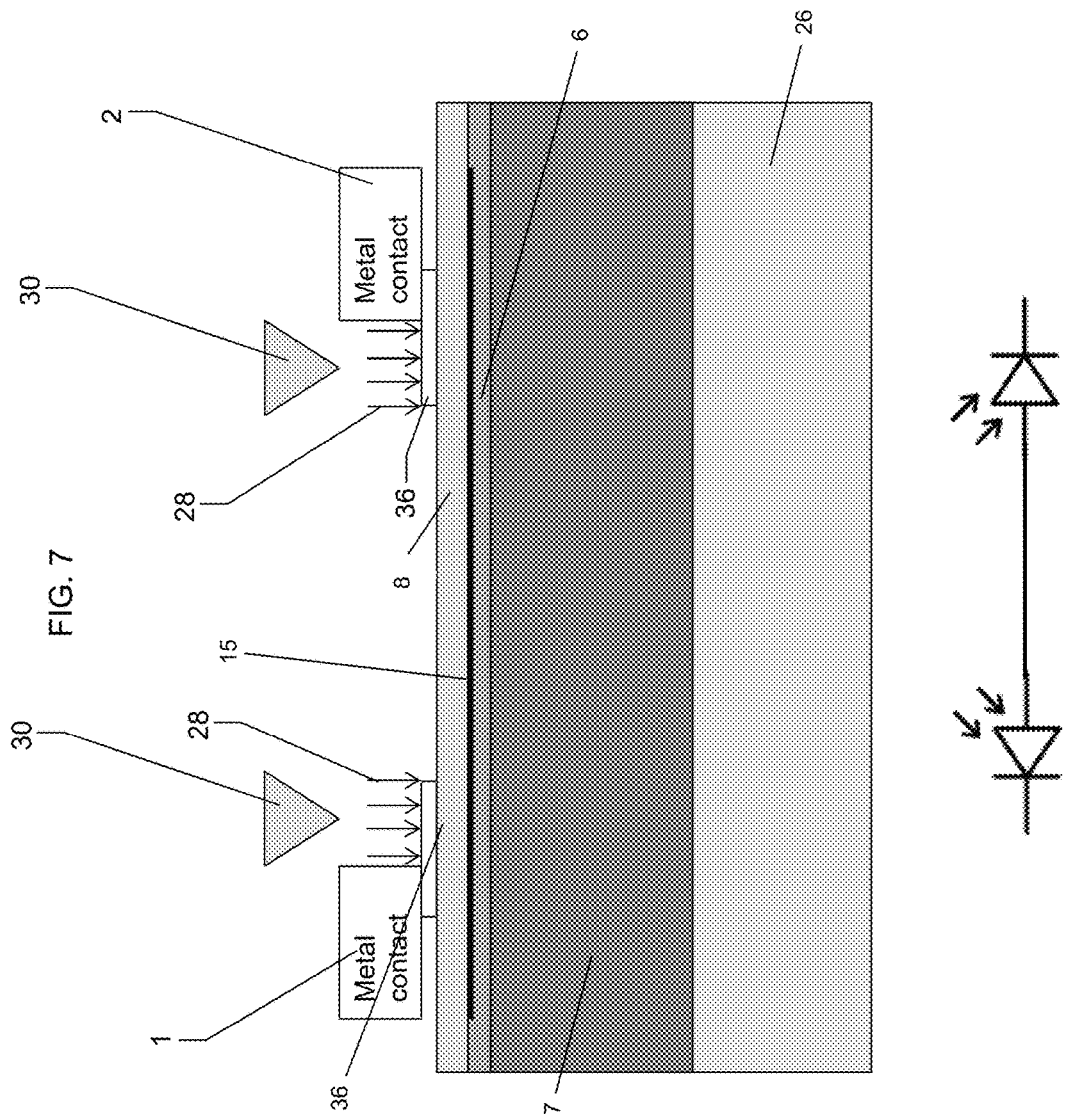
FIG. 7 is a diagram showing a back-to-back photo diode.

Additional embodiments of devices described herein can include back-to-back III-Nitride photodiodes, such as shown in FIG. 7. FIG. 7 shows a Schottky contact 36 connected to a metal contact 1, 2 serving as a gate. The Schottky contact 36 can be positioned over a normally off region of a low resistance 2DEG 15. In some embodiments, the Schottky contact 36 can pass/light 28 from a light source 30 to a normally open region 20 where charge carriers can be generated by the light. In some embodiments, the Schottky contact 36 can be transparent or include a light path through or around the connection, such as by providing one or more wave guides or openings or light pathways through or around the Schottky contact 36 to the normally off region 20. In some embodiments, the Schottky contact 36 can generate charge carriers in response to being irradiated with light 28, and such charge carriers can cause or facilitate conduction between a contact 1,2 to the low resistance 2DEG 15. In some embodiments, one or more ohmic contact 1, 2 contacts the supply layer 8 through a Schottky contact 36. In some embodiments, a device shown in FIG. 7 can be used in conjunction with one or more field plates 34, such as those shown in FIGS. 6 and 8. The back-to-back diodes can block both positive and negative voltage when the UV light is off. Such devices can share the depletion of the same 2DEG 15. When the UV light is on, both diodes conduct, resulting in a low on-resistance. In some embodiments, the device of FIG. 7 can be modeled as including two photodiodes in series, as shown in FIG. 7.

Figure 8:
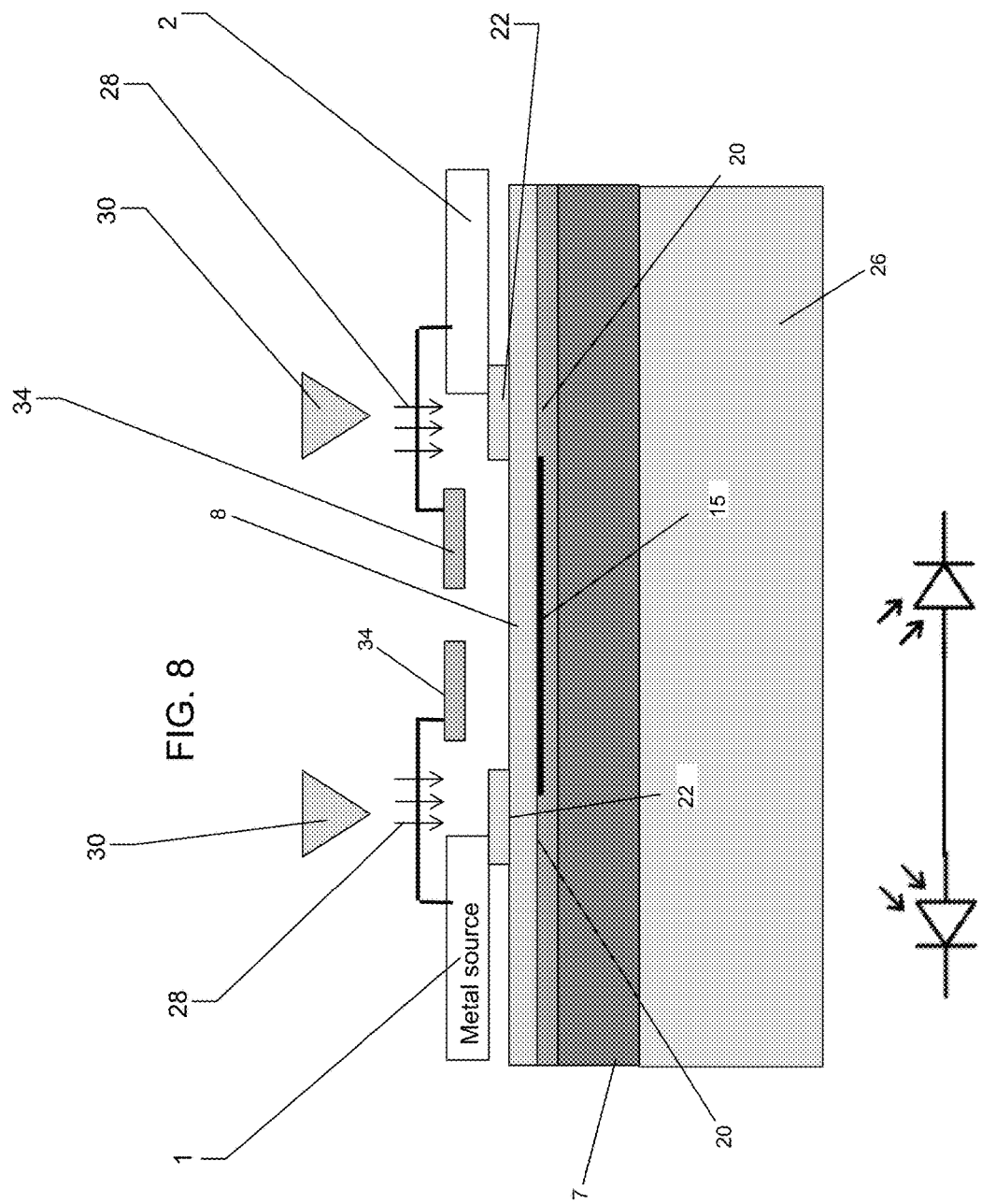
FIG. 8 is a diagram showing a solid state photo diode-relay

FIG. 8 shows a diode anode 38, such as a P-N junction diode functionally connected between an ohmic contact 1, 2, such as a metal source or a metal drain, and a supply layer 8. The diode 38 is positioned in functional relationship to a normally off region 20 of a low resistance 2DEG 15. The diode can be transparent or include a light path through or around the connection, such as by providing one or more wave guides or openings or light pathways through or around the diode anode 38 to the normally off region 22. In some embodiments, the diode anode 38 can generate charge carriers in response to being irradiated with light 28, and such charge carriers can cause or facilitate conduction between a contact 1,2 to the low resistance 2DEG 15. In some embodiments, the device of FIG. 8 can include one or more optional field gates 34 connected to one or more contacts 1, 2, so as to allow light 28 to irradiate the normally off region 20 and/or the diode anode 38 In some embodiments, the device of FIG. 8 can be modeled as including two photodiodes in series, as shown in FIG. 8.

FIGS. 7 and 8 show a transparent gate 22 on a 2DEG 15 connected to adjacent ohmic contact 1, 2. The gate 22 can be a Schottky contact 36, as in FIG. 7 or an insulating gate with a diode 38, such as a p-n diode or a transparent diode, as in FIG. 8. In some embodiments, the gate contacts 1, 2 can be transparent/semitransparent to the irradiating light or have provision for routing the irradiating light to the appropriate location(s) to generate charge carriers.

In some embodiments, devices described herein can be made utilizing III-Nitride and can exhibit advantageous properties such as a high breakdown field of >100 V/$\mu$m or >150 V/$\mu$m or >200 V/$\mu$m or >250 V/$\mu$m or >300V/$\mu$m or >320V/$\mu$m or >330V/$\mu$m and higher and/or high 2DEG mobility of >1200 cm$^2$/V-sec, >1300 cm$^2$/V-sec, >1400 cm$^2$/V-sec, >1500 cm$^2$/V-sec, >1600 cm$^2$/V-sec, >1700 cm$^2$/V-sec or higher, and can have the potential for an on-resistance of less than about 3% or less than about 2% or less than about 1% or less than about 0.5% of that for a Si device operating at the same breakdown voltage. In some embodiments, such as where the electric field is less uniform, lower values can be exhibited, such as >100 V/$\mu$m or >150 V/$\mu$m or >200 V/$\mu$m. In some instances were lateral devices are used, the electric field can be less uniform and lower values such as >100 V/$\mu$m or >150 V/$\mu$m or >200 V/$\mu$m can be exhibited The photo controlled switch can in some embodiments eliminate or supplement the use of floating gate drives, resulting cost reduction and/or greater reliability.

Prophetic Examples

Example 1

Relays and switches, as described herein, can be used to switch 150 kW 240V generators in and out on commercial, military or private aircraft. Relays and switches, as described herein can be used as 1200V AC switches for aviation and other uses.

Example 2

Relays and switches, as described herein, can be used to switch generators, capacitors, and other energy sources/ storage devices in and out for high energy consuming weapons, including lasers and railguns.

Example 3

Relays and switches, as described herein, can turn power on and off in electric and/or hybrid vehicles, for charging electric and/or hybrid vehicles, and can be suitable for DC and AC power. Relays and switches, as described herein can also be used in a power inverter for electric and/or hybrid vehicles, including those utilizing voltages of >400 V, >500V, >600V and/or >700V.

Example 4

Relays and switches described herein can be used for switching power from an electrical grid and for electrical grid relays and can be designed for voltages of 220V, 240V, 460V, 1200V, 12,000V, and higher and for voltages between these values.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein. The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

Concepts

Concept 1. An electronic relay comprising a first photo-switch, a second photo-switch, and a shared drift region operationally coupled to the first photo switch and the second photo-switch.

Concept 2. The electronic relay of Concept 1, wherein the first photoswitch comprises a first normally off region of the shared drift region and the second photoswitch comprises a second normally off region of the shared drift region.

Concept 3. The electronic relay of Concept 2, wherein when the first photoswitch is irradiated with light of a first suitable wavelength, the first normally off region becomes conductive and when light of a second suitable wavelength irradiates the second photoswitch, the second normally off region becomes conductive.

Concept 4. The electronic relay of Concept 3, wherein the first and second wavelength are substantially the same wavelength.

Concept 5. The electronic relay of Concept 1, wherein one of the first and second photoswitches is a back-to-back AC high-voltage III-Nitride photo-diode.

Concept 6. The electronic relay of Concept 1, wherein the first and second photoswitches are photo-diodes.

Concept 7. The electronic relay of Concept 1, wherein the first photoswitch comprises a first photo-transistor.

Concept 8. The electronic relay of Concept 1, wherein the first photoswitch comprises a photo-transistor and the second photoswitch comprises a second photo-transistor.

Concept 9. The electronic relay of Concept 1, wherein the drift region comprises a 2 dimensional electron cloud ("2DEG").

Concept 10. The electronic relay of Concept 3, further comprising a first and second gate and a first and second ohmic contact, wherein the first and second gates are located proximate to the first and second normally off regions, respectively, and, the first and second ohmic contacts, respectively, and the first gate is in electrical communication with the first ohmic contact and the second gate is in electrical communication with the second ohmic contact.

Concept 11. The electronic relay of Concept 10, wherein the first and second gates are configured to convey light incident on each respective gate to the first and second normally off region, respectively.

Concept 10. The electronic relay of Concept 11, wherein the first gate conveys more than 50% of the light of the first wavelength it is irradiated with.

Concept 11. The electronic relay of Concept 11, wherein the second gate conducts more than 50% of the light of the second wavelength it is irradiated with.

Concept 12. The electronic relay of Concept 1, wherein the relay has a switching time for switching from an off state to an on state and the switching time is less than 1000 ns.

Concept 13. The electronic relay of Concept 1, wherein the relay has a switching time for switching from an off state to an on state and the switching time is less than 100 ns.

Concept 14. The electronic relay of Concept 1, wherein the relay has a switching time for switching from an off state to an on state and the switching time is less than 10 ns.

Concept 15. The electronic relay of Concept 1, wherein the drift region occurs at an interface of a Group III channel layer and a Group III Nitride supply layer.

Concept 16. The electronic relay of claim 1, wherein the drift region occurs at an interface of GaN and AlGaN.

Concept 17. A method of making the electronic relay of Concept 2, wherein the method comprises forming the first and second normally off regions by one or more methods from the list consisting of recess etching the supply layer, including a P-type material in the normally off region, and including a P-type gate, where the method for the first normally off region is different from the method for the second normally off region.

Concept 18. A method of making the electronic relay of Concept 2, wherein the method comprises forming the first and second normally off regions by one or more methods from the list consisting of recess etching the supply layer, including a P-type material in the normally off region, and including a P-type gate, where the method for the first normally off region is the same as the method for the second normally off region.

Concept 19. The electronic relay of Concept 11, wherein the first gate is a transparent gate comprising SnO.

We claim:

1. An electronic relay comprising a two dimensional electron gas (2DEG) connecting a first photoswitch to a second photoswitch.

2. The electronic relay of claim 1, wherein the first photoswitch comprises a first normally off region connected to the 2DEG and the second photoswitch comprises a second normally off region connected to the 2DEG.

3. The electronic relay of claim 2, wherein when the first photoswitch is irradiated with light of a first suitable wavelength, the first normally off region becomes conductive and when light of a second suitable wavelength irradiates the second photoswitch, the second normally off region becomes conductive.

4. The electronic relay of claim 3, wherein the first and second wavelengths are substantially the same wavelength.

5. The electronic relay of claim 3, further comprising a first and second gate and a first and second ohmic contact, wherein the first and second gates are located proximate to the first and second normally off regions, respectively, and the first and second ohmic contacts, respectively, and the first gate is in electrical communication with the first ohmic contact and the second gate is in electrical communication with the second ohmic contact.

6. The electronic relay of claim 5, wherein the first and second gates are configured to convey light incident on each respective gate to the first and second normally off region, respectively.

7. The electronic relay of claim 6, wherein the first gate conveys more than 50% of the light of the first wavelength it is irradiated with.

8. The electronic relay of claim 6, wherein the second gate conducts more than 50% of the light of the second wavelength it is irradiated with.

9. The electronic relay of claim 6, wherein the first gate is a transparent gate comprising SnO.

10. A method of making the electronic relay of claim 2, wherein the method comprises forming the first and second normally off regions by one or more methods from the list consisting of recess etching the supply layer, including a P-type material in the normally off region, and including a P-type gate, where the method for the first normally off region is different from the method for the second normally off region.

11. A method of making the electronic relay of claim 2, wherein the method comprises forming the first and second normally off regions by one or more methods from the list consisting of recess etching the supply layer, including a P-type material in the normally off region, and including a P-type gate, where the method for the first normally off region is the same as the method for the second normally off region.

12. The electronic relay of claim 1, wherein one of the first and second photoswitches is a back-to-back AC high-voltage III-Nitride photo-diode.

13. The electronic relay of claim 1, wherein the first and second photoswitches are photo-diodes.

14. The electronic relay of claim 1, wherein the first photoswitch comprises a first photo-transistor.

15. The electronic relay of claim 1, wherein the first photoswitch comprises a photo-transistor and the second photoswitch comprises a second photo-transistor.

16. The electronic relay of claim 1, wherein the relay has a switching time for switching from an off state to an on state and the switching time is less than 1000 ns.

17. The electronic relay of claim 1, wherein the relay has a switching time for switching from an off state to an on state and the switching time is less than 100 ns.

18. The electronic relay of claim 1, wherein the relay has a switching time for switching from an off state to an on state and the switching time is less than 10 ns.

19. The electronic relay of claim 1, wherein the 2DEG occurs at an interface of a Group III channel layer and a Group III Nitride supply layer.

20. The electronic relay of claim 1, wherein the 2DEG occurs at an interface of GaN and AlGaN.

21. The electronic relay of claim 1, further comprising a supply layer and a channel layer, wherein the 2DEG forms at an interface between the supply layer and the channel layer.

* * * * *